(12) United States Patent
Nakamura

(10) Patent No.: US 6,590,446 B2
(45) Date of Patent: Jul. 8, 2003

(54) AMPLIFIER CIRCUIT AND ELECTRONIC APPARATUS USING THE SAME

(75) Inventor: Takeshi Nakamura, Uji (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/933,849

(22) Filed: Aug. 21, 2001

(65) Prior Publication Data

US 2002/0044015 A1 Apr. 18, 2002

(30) Foreign Application Priority Data

Oct. 12, 2000 (JP) ....................................... 2000-312141

(51) Int. Cl.[7] ............................................... H03F 1/14
(52) U.S. Cl. ......................................... 330/51; 330/136
(58) Field of Search ........................... 330/51, 136, 150

(56) References Cited

U.S. PATENT DOCUMENTS 5,119,042 A * 6/1992 Crampton et al. .......... 330/136
5,138,274 A * 8/1992 Nakanishi et al. .......... 330/136
6,252,455 B1 * 6/2001 Kurby et al. ................ 330/129

* cited by examiner

Primary Examiner—Robert Pascal
Assistant Examiner—Khanh Van Nguyen
(74) Attorney, Agent, or Firm—Keating & Bennett, LLP

(57) ABSTRACT

An amplifier circuit includes an input terminal and a first amplifier. A node between the input terminal and the first amplifier is connected to a first input of a comparator circuit. A node between a second amplifier at the final stage and an output terminal is connected to a second input of the comparator circuit. The output of the comparator circuit is connected to a signal blocking circuit. The comparator circuit compares voltages of two input signals. When the output voltage of the second amplifier falls below the input voltage of the first amplifier, the signal blocking circuit is switched from an ON state to an OFF state. Thus, the second amplifier can be protected from excessive current caused by short-circuiting of the output terminal, without deteriorating the dumping factor and the transient characteristic. Even when the signal level is so low that only a minute current flows, it is possible to detect short-circuiting of the output terminal and to protect the second amplifier.

18 Claims, 2 Drawing Sheets

AMPLIFIER CIRCUIT AND ELECTRONIC APPARATUS USING THE SAME

BACKGROUND OF THE INVENTION

1. Field of the Invention

The present invention relates to an amplifier circuit and an electronic apparatus including the same, such as a speaker-driving amplifier circuit and an electronic apparatus including the same.

2. Description of the Related Art

FIG. 4 shows a conventional amplifier circuit. Referring to FIG. 4, an amplifier circuit 1 includes an input terminal 2, three amplifiers 3, 4, and 6 which are connected in series from the first stage to the final stage, a signal blocking circuit 5, a detection resistor 7, an output terminal 8, and a comparator circuit 9. In particular, the amplifier 6 is a buffer amplifier that can generate a large output current even when the amplification factor is small. Sometimes the buffer amplifier is attached externally, separate from the other amplifiers. In such a case, it is often impossible to provide a built-in function (feedback loop) wherein the output current is returned in feedback manner to the input side and the output current is prevented from becoming too high.

The input terminal 2 is connected to the signal blocking circuit 5 through the amplifiers 3 and 4 in this order. The signal blocking circuit 5 is connected to the output terminal 8 through the amplifier 6 and the detection resistor 7 in this order. Both ends of the detection resistor 7 are connected to the comparator circuit 9. The output of the comparator circuit 9 is connected to the signal blocking circuit 5. The comparator circuit 9 rectifies two input signals and determines whether or not the difference between the two input signals exceeds a predetermined value.

In the amplifier circuit 1 arranged as described above, the amplifiers 3, 4, and 6 are arranged so that the output voltages sequentially increase starting from the amplifier 4 at the first stage to amplifier 6 at the final stage. On the basis of the potential difference across the detection resistor 7, the comparator circuit 9 detects the magnitude of the output current of the amplifier 6 at the final stage. For example, when the output terminal 8 is short-circuited, causing a high current to flow into the detection resistor 7, the potential difference across the detection resistor 7 increases. The comparator circuit 9 detects when the potential difference exceeds a predetermined level and controls the signal blocking circuit 5 to block a signal output from the amplifier 4 from entering the amplifier 6. As a result, excessive current is prevented from flowing out from the amplifier 6. Accordingly, even when the buffer amplifier is externally attached to the amplifier circuit 1, the amplifier 6 is protected from excessive current caused by short-circuiting of the output terminal.

In the amplifier circuit 1 shown in FIG. 4, the detection resistor 7 is arranged in series in a signal path. Thus, the output impedance of the amplifier 6 increases, and the dumping factor deteriorates. Also, the transient characteristic deteriorates, and the steepness of the rising characteristic is lost. A current that flows through the detection resistor 7 is used to detect excessive current. When the output current value is small, such as when a sound output from an audio system is small, and when the output terminal 8 is short-circuited, the current that flows through the detection resistor 7 is too small to detect excessive current. As a result, the output short current continues to flow.

SUMMARY OF THE INVENTION

In order to overcome the problems described above, preferred embodiments of the present invention provide an amplifier circuit that can detect a short circuit even when output current is low and that can protect an amplifier via a simple circuit configuration, and also provide an electronic apparatus including such a novel amplifier circuit.

According to a preferred embodiment of the present invention, an amplifier circuit includes at least two amplifiers connected in series from the first stage to the final stage or one amplifier which functions as an amplifier at the first stage and an amplifier at the final stage. The amplifier circuit includes a detection circuit for detecting a variation in the amplification by comparing the input voltage of one amplifier with the output voltage of the amplifier at the final stage, and an output stopping circuit for stopping the output of the amplifier at the final stage based on the detection result obtained by the detection circuit.

According to another preferred embodiment of the present invention, an amplifier circuit includes at least two amplifiers connected in series from the first stage to the final stage or one amplifier that functions as both as an amplifier at the first stage and an amplifier at the final stage. The amplifier circuit includes a detection circuit which is connected at the input side of one amplifier and at the output side of the amplifier at the final stage and which detects a variation in the amplification by comparing the voltage of the one amplifier with the voltage of the amplifier at the final stage, and an output stopping circuit which is connected to the output of the detection circuit and which stops the output of the amplifier at the final stage based on the detection result obtained by the detection circuit.

It is preferred that no feedback loop from the amplifier at the final stage to the amplifier at a previous stage is included.

The detection circuit may include a comparator that compares the input voltage of one amplifier with the voltage of the amplifier at the final stage and that detects a state in which the ratio between the two voltages changes.

The detection circuit may include a comparator that compares the input voltage of one amplifier with the output voltage of the amplifier at the final stage and that detects a state in which the output voltage of the amplifier at the final stage falls below the input voltage of the one amplifier.

The output stopping circuit may include a power-off circuit that cuts off the power supply to the amplifier at the final stage.

The output stopping circuit may include a signal blocking circuit that blocks an input signal from entering the amplifier at the final stage.

According to another preferred embodiment of the present invention, an electronic apparatus includes an amplifier circuit according to preferred embodiments described above.

According to an amplifier circuit of preferred embodiments of the present invention, it is possible to detect a short-circuited output using a simple circuit configuration and to protect an amplifier at the final stage from damage resulting from a short-circuited output.

According to an electronic apparatus of a preferred embodiment of the present invention, reliability and performance of the apparatus are greatly improved.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
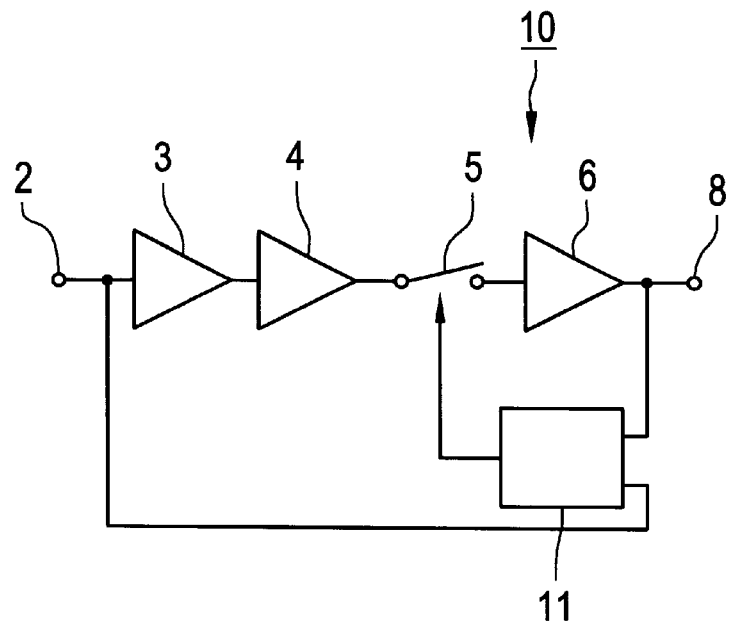
FIG. 1 is a circuit diagram of an amplifier circuit according to a first preferred embodiment of the present invention.
Figure 4:
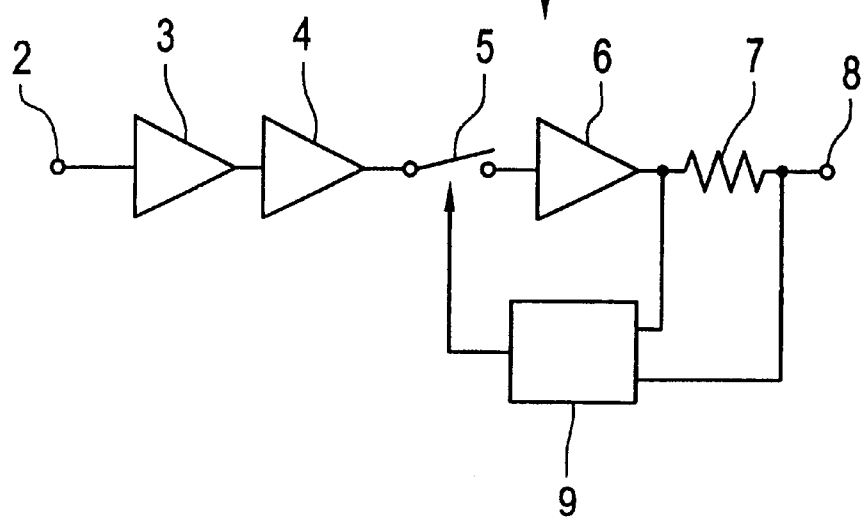
FIG. 4 is a circuit diagram of a conventional amplifier circuit.

FIG. 1 shows an amplifier circuit according to a first preferred embodiment of the present invention. In FIG. 1, the same reference numerals are used to indicate similar elements included in FIG. 4.

Referring to FIG. 1, an amplifier circuit 10 preferably includes an input terminal 2, three amplifier circuits 3, 4, and 6 which are connected in series from the first stage to the final stage, a signal blocking circuit 5 which is an output stopping circuit, an output terminal 8, and a comparator circuit 11 which is a detection circuit. The input terminal 2 is connected to the signal blocking circuit 5 through the amplifiers 3 and 4 in this order. The signal blocking circuit 5 is connected to the output terminal 8 through the amplifier 6. The node between the input terminal 2 and the amplifier circuit 3 is connected to a first input of the comparator circuit 11. The node between the amplifier 6 at the final stage and the output terminal 8 is connected to a second input of the comparator circuit 11. The output of the comparator circuit 11 is connected to the signal blocking circuit 5. There is no built-in feedback loop for improving the frequency characteristic by feeding back the output of the amplifier 6 at the final stage to the amplifiers 3 and 4. However, a loop that feeds the output of the amplifier 4 back to the amplifier 3 may be provided.

The comparator circuit 11 has a sufficiently high input impedance. The comparator circuit 11 rectifies voltages of two input signals and compares the two voltages, thereby detecting whether or not the output voltage of the amplifier 6 has fallen below the input voltage of the amplifier 3. The comparator circuit 11 switches the signal blocking circuit 5 between an ON state and an OFF state.

In the amplifier circuit 10 having this arrangement, the output voltage of the amplifier 6 decreases when the output terminal 8 is short-circuited or nearly short-circuited for some reason. The comparator circuit 11 detects when the output voltage of the amplifier 6 falls below the input voltage of the amplifier 3 and instructs the signal blocking circuit 5 to block a signal output from the amplifier 4 from entering the amplifier 6. As a result, excessive current is prevented from flowing out from the amplifier 6. Accordingly, in the amplifier circuit 10, the amplifier 6 is protected from the excessive current caused by the short-circuited or nearly short-circuited output terminal 8.

Unlike a conventional amplifier circuit 1, no detection resistor is inserted in series into a signal path. As a result, the dumping factor is not deteriorated by an increase in the output impedance of the amplifier 6. The transient characteristic does not deteriorate, nor is the steepness of the rising characteristic affected or deteriorated.

When the signal level is so low that only a very small current flows, it is still possible to detect the short-circuited or nearly short-circuited output terminal 8 and to protect the amplifier 6 at the final stage.

In the amplifier circuit 10, the input voltage of the amplifier 3 is used as a first signal input to the comparator circuit 11, and the output signal of the amplifier 6 at the final stage is used as a second signal input to the comparator circuit 11. Alternatively, the input voltage of the amplifier 4 or the amplifier 6 can be used as the first signal input to the comparator circuit 11. The more subsequent the amplifier, the higher the input voltage thereof becomes and the smaller the difference between this input voltage and the output voltage of the amplifier 6 at the final stage becomes. When the input voltage of the amplifier 6 at the final stage is used as the first signal input to the comparator circuit 11, at the beginning when the output terminal 8 is short-circuited, the signal blocking circuit 5 is operated in response to a slight decrease in output voltage of the amplifier 6.

In the amplifier circuit 10, the comparator circuit 11 determines whether or not the output voltage of the amplifier 6 has fallen below the input voltage of the amplifier 3.

However, the present invention is not limited to the above-described preferred embodiments. For example, when the amplifier circuit 10 is performing linear amplification, and when the level difference (ratio) between the input voltage of the amplifier 3 and the output voltage of the amplifier 6 is about 20 dB, the comparator is designed such that the comparator circuit 11 detects a state in which the level difference between the two voltages falls slightly below approximately 20 dB or 10 dB, that is, a state in which the ratio between the two voltages changes, and activates the signal blocking circuit 5. In this case, in addition to protection from short-circuiting of the output terminal 8, it is possible to perform protection against circumstances wherein the amplifier circuit 10 is prevented from performing linear amplification by inputting an extraordinarily large signal that is not used in normal operating conditions. Accordingly, it is possible to protect the amplifier 6 and a speaker connected to the output terminal 8.

Figure 2:
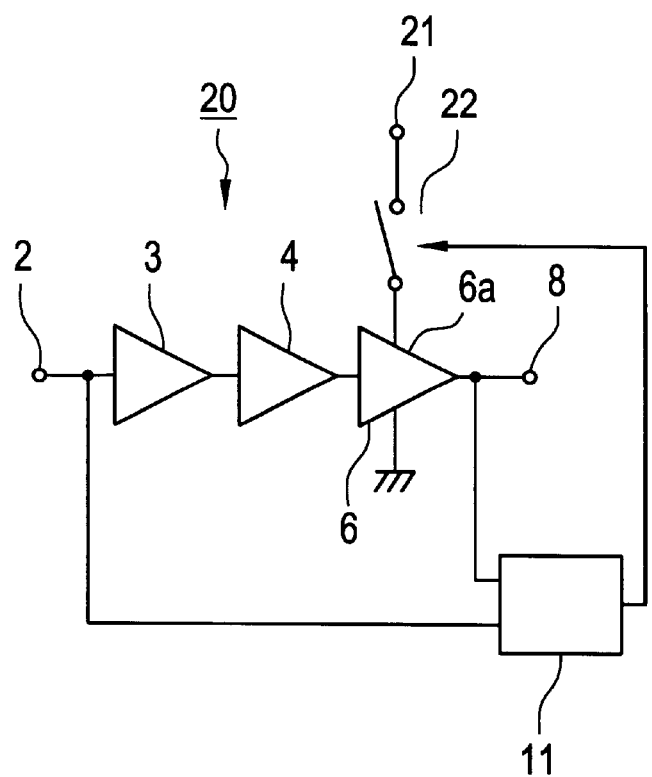
FIG. 2 is a circuit diagram of an amplifier circuit according to a second preferred embodiment of the present invention.

FIG. 2 shows an amplifier circuit according to a second preferred embodiment of the present invention. In FIG. 2, the same reference numerals are used to indicate similar elements that correspond to those in FIG. 1, and repetitious descriptions of the common portions are omitted.

Referring to FIG. 2, an amplifier circuit 20 differs from the amplifier circuit 10 shown in FIG. 1 in that the amplifier 4 and the amplifier 6 are directly connected to each other and that a power-off circuit 22 which is an output stopping circuit is provided in a path for supplying the power supply voltage to the amplifier 6. In the amplifier circuit 20, the amplifier 6 includes a power supply circuit that is omitted in FIG. 1. The power-off circuit 22 is disposed between a power terminal 21 and a power supply voltage input terminal 6a of the amplifier 6. The output of the comparator circuit 11 is connected to the power-off circuit 22. The comparator circuit 11 has a sufficiently high input impedance. The comparator circuit 11 compares voltages of two input signals and determines whether or not the output voltage of the amplifier 6 falls below the input voltage of the amplifier 3. The comparator circuit 11 has a function of switching the power-off circuit 22 between an ON state and an OFF state.

In the amplifier circuit 20 having this arrangement, the output voltage of the amplifier 6 decreases when the output terminal 8 is short-circuited. When the output voltage of the amplifier 6 falls below the input voltage of the amplifier 3, the comparator circuit 11 controls the power-off circuit 22 to stop the amplification by the amplifier 6, thereby preventing a signal output from the amplifier 6 from entering the output terminal 8. Accordingly, in the amplifier circuit 20, the amplifier 6 is protected from excessive current caused by short-circuiting of the output terminal 8.

As in the amplifier circuit 10, the dumping factor is not deteriorated by an increase in the output impedance. The transient characteristic does not deteriorate, nor is the steepness of the rising characteristic affected or decreased. When the signal level is so low that only a low current flows, it is possible to detect short-circuiting of the output terminal 8 and to protect the amplifier 6 at the final stage.

In the amplifier circuit 20, as in the amplifier circuit 10, the input voltage of the amplifier 4 or the amplifier 6 can be used as the first signal input to the comparator circuit 11. Also, the comparator is designed such that the comparator circuit 11 detects the moment at which the amplifier circuit 20 stops performing linear amplification. The amplifier circuit 20 obtains advantages that are similar to those of the amplifier circuit 10.

Although amplifier circuits each including three amplifiers in series have been described in the foregoing preferred embodiments, the number of amplifiers is not fixed as long as there is at least one amplifier. When only one amplifier is used, the same amplifier functions both as an amplifier at the first stage and an amplifier at the final stage.

Figure 3:
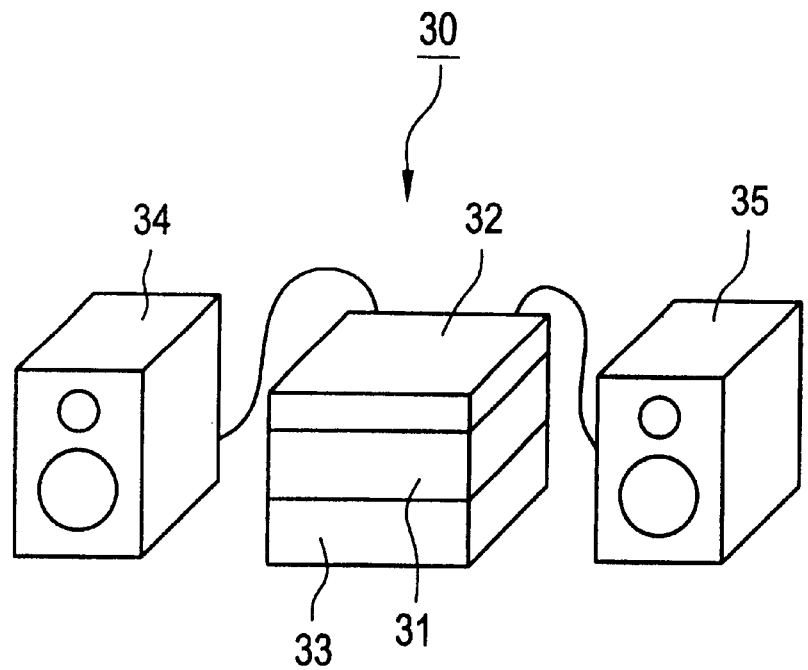
FIG. 3 is a perspective view of an electronic apparatus according to a third preferred embodiment of the present invention.

FIG. 3 shows an electronic apparatus according to a third preferred embodiment of the present invention. Referring to FIG. 3, an electronic apparatus 30 is a preferably a stereo apparatus that includes an amplifier 31, a buffer amplifier 32, an audio player 33, and two speakers 34 and 35. The audio player 33 is a unit such as a CD player or a tuner that outputs audio signals. The output of the audio player 33 is connected to the amplifier 31. The output of the amplifier 31 is connected to the buffer amplifier 32. The output of the buffer amplifier 32 is connected to the two speakers 33 and 34. From among these components, the amplifier 31 and the buffer amplifier 32 define an amplifier circuit of other preferred embodiments of the present invention. The buffer amplifier 32 includes therein a detection circuit and an output stopping circuit. Although not shown in FIG. 3, a wire for inputting the input voltage of one of amplifiers included in the amplifier 31 to the detection circuit is arranged between the amplifier 31 and the buffer amplifier 32.

Since the electronic apparatus 30 having this arrangement includes an amplifier circuit according to other preferred embodiments of the present invention, it is possible to protect the buffer amplifier 32 against damage caused by short circuiting of a terminal connected to the speaker. As a result, the reliability of the electronic apparatus is greatly improved.

While the present invention has been particularly shown and described with reference to preferred embodiments thereof, it will be understood by those skilled in the art that the foregoing and other changes in form and details can be made without departing from the spirit and scope of the invention.

What is claimed is:

1. An amplifier circuit comprising:
    at least two amplifiers connected in series from a first stage to a final stage;
    a detection circuit for detecting a variation in amplification of the at least two amplifiers by comparing an input voltage of one of the at least two amplifiers with an output voltage of the one of the at least two amplifiers at the final stage; and
    an output stopping circuit for stopping the output of the one of the at least two amplifiers at the final stage based on the detection result obtained by said detection circuit; wherein
    said output stopping circuit comprises a signal blocking circuit that blocks an input signal from entering the one of the at least two amplifiers at the final stage.

2. An amplifier circuit according to claim 1, wherein no feedback loop is arranged to extend from the one of the at least two amplifiers at the final stage to an amplifier at a previous stage.

3. An amplifier circuit according to claim 1, wherein said detection circuit comprises a comparator that compares the input voltage of one of the at least two amplifiers with the voltage of the one of the at least two amplifiers at the final stage and that detects a state in which the ratio between the two voltages changes.

4. An amplifier circuit according to claim 1, wherein said detection circuit comprises a comparator that compares the input voltage of one of the at least two amplifiers with the output voltage of the one of the at least two amplifiers at the final stage and that detects a state in which the output voltage of the one of the at least two amplifiers at the final stage falls below the input voltage of said one of the at least two amplifiers.

5. An amplifier circuit according to claim 1, wherein said output stopping circuit comprises a power-off circuit that cuts off the power supply to the one of the least two amplifiers at the final stage.

6. An electronic apparatus comprising an amplifier circuit as set forth in claim 1.

7. An amplifier circuit comprising:
    at least two amplifiers connected in series from a first stage to a final stage;
    a detection circuit that is connected at an input side of one of the at least two amplifiers and at an output side of the one of the at least two amplifiers at the final stage and which detects a variation in the amplification by comparing the voltage of said one of the at least two amplifiers with the voltage of the one of the at least two amplifiers at the final stage; and
    an output stopping circuit which is connected to the output of said detection circuit and which stops the output of the amplifier at the final stage based on the detection result obtained by said detection circuit; wherein
    said output stopping circuit comprises a signal blocking circuit that blocks an input signal from entering the one of the at least two amplifiers at the final stage.

8. An amplifier circuit according to claim 7, wherein no feedback loop is arranged to extend from the one of the at least two amplifiers at the final stage to an amplifier at a previous stage.

9. An amplifier circuit according to claim 7, wherein said detection circuit comprises a comparator that compares the input voltage of one of the at least two amplifiers with the voltage of the one of the at least two amplifiers at the final stage and that detects a state in which the ratio between the two voltages changes.

10. An amplifier circuit according to claim 7, wherein said detection circuit comprises a comparator that compares the input voltage of one of the at least two amplifiers with the output voltage of the one of the at least two amplifiers at the final stage and that detects a state in which the output voltage of the one of the at least two amplifiers at the final stage falls below the input voltage of said one of the at least two amplifiers.

11. An amplifier circuit according to claim 7, wherein said output stopping circuit comprises a power-off circuit that cuts off the power supply to the one of the least two amplifiers at the final stage.

12. An electronic apparatus comprising an amplifier circuit as set forth in claim 7.

13. An amplifier circuit comprising:

an amplifier that is arranged to define an amplifier at a first stage and an amplifier at a final stage;

a detection circuit for detecting a variation in amplification one of the amplifiers at the first stage and at the final stage by comparing an input voltage of the amplifier at the first stage with an output voltage of the amplifier at the final stage; and an output stopping circuit for stopping the output of the amplifier at the final stage based on the detection result obtained by said detection circuit; wherein said output stopping circuit comprises a signal blocking circuit that blocks an input signal from entering the amplifier at the final stage.

14. An amplifier circuit according to claim 13, wherein no feedback loop is arranged to extend from the amplifier at the final stage to an amplifier at a previous stage.

15. An amplifier circuit according to claim 13, wherein said detection circuit comprises a comparator that compares the input voltage of the amplifier at the first stage with the voltage of the amplifier at the final stage and that detects a state in which the ratio between the two voltages changes.

16. An amplifier circuit according to claim 13, wherein said detection circuit comprises a comparator that compares the input voltage of the amplifier at the first stage to the output voltage of the amplifier at the final stage and that detects a state in which the output voltage of amplifier at the final stage falls below the input voltage of the amplifier at the first stage.

17. An amplifier circuit according to claim 13, wherein said output stopping circuit comprises a power-off circuit that cuts off the power supply to the amplifier at the final stage.

18. An electronic apparatus comprising an amplifier circuit as set forth in claim 13.

* * * * *